(12) United States Patent
Choi et al.

(10) Patent No.: US 8,809,895 B2
(45) Date of Patent: Aug. 19, 2014

(54) LIGHT EMITTING DEVICE AND METHOD OF FABRICATING THE SAME

(75) Inventors: Kwang Ki Choi, Seoul (KR); Hwan Hee Jeong, Seoul (KR); Sang Youl Lee, Seoul (KR); June O Song, Seoul (KR); Ji hyung Moon, Seoul (KR); Se Yeon Jung, Seoul (KR); Tae-Yeon Seong, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 273 days.

(21) Appl. No.: 13/175,549

(22) Filed: Jul. 1, 2011

(65) Prior Publication Data
US 2012/0001218 A1 Jan. 5, 2012

(30) Foreign Application Priority Data

Jul. 5, 2010 (KR) ........................ 10-2010-00064560

(51) Int. Cl.
*H01L 33/14* (2010.01)
*H01L 33/46* (2010.01)
*H01L 33/64* (2010.01)

(52) U.S. Cl.
USPC ..................................... 257/99; 257/E33.068

(58) Field of Classification Search
None
See application file for complete search history.

(56) References Cited

U.S. PATENT DOCUMENTS

| 6,078,064 A * | 6/2000 | Ming-Jiunn et al. ......... 257/103 |
| 2005/0199894 A1 * | 9/2005 | Rinzler et al. .................. 257/94 |
| 2009/0011278 A1 | 1/2009 | Choi et al. |
| 2009/0108250 A1 | 4/2009 | Kim et al. |
| 2010/0148183 A1 * | 6/2010 | Ward et al. ...................... 257/76 |

FOREIGN PATENT DOCUMENTS

| JP | 2009-16332 A | | 1/2009 |
| KR | 10-2009-0032631 A | | 4/2009 |
| KR | 2009032631 A | * | 4/2009 |
| KR | 10-2009-0043057 A | | 5/2009 |
| KR | 10-2010-0015084 A | | 2/2010 |
| KR | 10-2010-0091499 A | | 8/2010 |

OTHER PUBLICATIONS

Machine translation of KR 10-2009-0032631.*
Cree Data Sheet downloaded from URL<http://scn.cree.com/_onelink_/cree/en2zh/products/pdf/MAT-CATALOG.pdf?bcsi-ac-2160f1cfec5c399f=2012EBB400000102OC2xZf1PNIJXBZtLF0ZL4Cc+vRJyGAAAAgEAAMfHWwCEAwAAAgAAAPt4JgA=f> on Mar. 28, 2013.*
Lee, K., Z. Wu, Z. Chen, F. Ren, S. J. Pearton, and A. G. Rinzler. "Single Wall Carbon Nanotubes for P-Type Ohmic Contacts to GaN Light-Emitting Diodes." Nano Letters 4.5 (2004): 911-14.*

(Continued)

*Primary Examiner* — Thomas L Dickey
*Assistant Examiner* — Joseph Schoenholtz
(74) *Attorney, Agent, or Firm* — Birch, Stewart, Kolasch & Birch, LLP

(57) ABSTRACT

Provided are a light emitting device and a method of fabricating the same. The light emitting device includes a first conductive type semiconductor layer, a second conductive type semiconductor layer, and an active layer between the first conductive type semiconductor layer and the second conductive type semiconductor layer, the active layer being formed of a semiconductor material. Also, the light emitting device further includes a current spreading layer comprising a plurality of carbon nanotube bundles physically connected to each other on one of the first and second conductive type semiconductor layers.

17 Claims, 9 Drawing Sheets

(56) References Cited

OTHER PUBLICATIONS

Hu, L. Hecht, D, Gruner, G, Carbon Nanotube Thin Films: Fabrication, Properties and Applications. Chem. Rev. 1020 (110 (10) pp. 5790-5844.*

"Final Report Conductive Coatings for Solar Cells Using Carbon Nanotubes" Eikos Inc NREL contract No. DE-FG36-05GO85035, Jun. 30, 2007.*

Pulickel, A and Zhou, O, "Application of Carbon Nanotubes" Topics Appl. Phys. 80, 391-425 (2001).*

Hu, L, Hecht, D, Gruner, G, "Carbon Nanotube Thin Films: Fabrication Properties and Applications" Chem Rev 2010, 110, 5790-5844.*

Indium Tin Oxie and Alternative Transparent Conductor Markets, Nanomarkets Apr. 2009.*

Trottier, C. M., P. Glatkowski, P. Wallis, and J. Luo. "Properties and Characterization of Carbon-nanotuve-based Transparent Conductive Coating." Journal of the Society of Information Display 13.9 (2005): 759-63.*

\* cited by examiner

LIGHT EMITTING DEVICE AND METHOD OF FABRICATING THE SAME

CROSS-REFERENCE TO RELATED APPLICATIONS

The present application claims priority under 35 U.S.C. §119(a) of Korean Patent Application No. 10-2010-00064560 filed on Jul. 5, 2010, which is hereby incorporated by reference in its entirety.

BACKGROUND

Embodiments relates to a light emitting device.

Recently, researches on device using light emitting diodes (LEDs) as a device for emitting light have been extensively carried out.

LEDs use the characteristics of a compound semiconductor to convert an electrical signal into light. LEDs have a light emitting structure including a first conductive type semiconductor layer, an active layer, and a second type conductive semiconductor layer.

SUMMARY

Embodiments provide a light emitting device having a new structure.

Embodiments also provide a light emitting device having improved light efficiency.

Embodiments also provide a light emitting device having superior current spreading characteristics.

In one embodiment, a light emitting device package includes: a first conductive type semiconductor layer; a second conductive type semiconductor layer; an active layer between the first conductive type semiconductor layer and the second conductive type semiconductor layer, the active layer being formed of a semiconductor material; and a current spreading layer including a plurality of carbon nanotube bundles physically connected to each other on one of the first and second conductive type semiconductor layers.

In another embodiment, a light emitting device includes: a first conductive type semiconductor layer; a second conductive type semiconductor layer; an active layer between the first conductive type semiconductor layer and the second conductive type semiconductor layer, the active layer being formed of a semiconductor material; and a current spreading layer in which a plurality of carbon nanotube bundles are connected to each other through a network on the second conductive type semiconductor layer, each of the carbon nanotube bundles comprising a plurality of single-walled carbon nanotubes.

In further another embodiment, a method of fabricating a light emitting device includes: forming a light emitting structure including a first conductive type semiconductor layer, an active layer, and a second conductive type semiconductor layer on a subtrate; etching the second conductive type semiconductor layer and the active layer to expose the first conductive type semiconductor layer; and repeatedly performing a coating process to form a current spreading layer in which carbon nanotube bundles formed using single-walled carbon nanotubes are connected to each other through a network.

The details of one or more embodiments are set forth in the accompanying drawings and the description below. Other features will be apparent from the description and drawings, and from the claims.

DETAILED DESCRIPTION OF THE EMBODIMENTS

Figure 1:
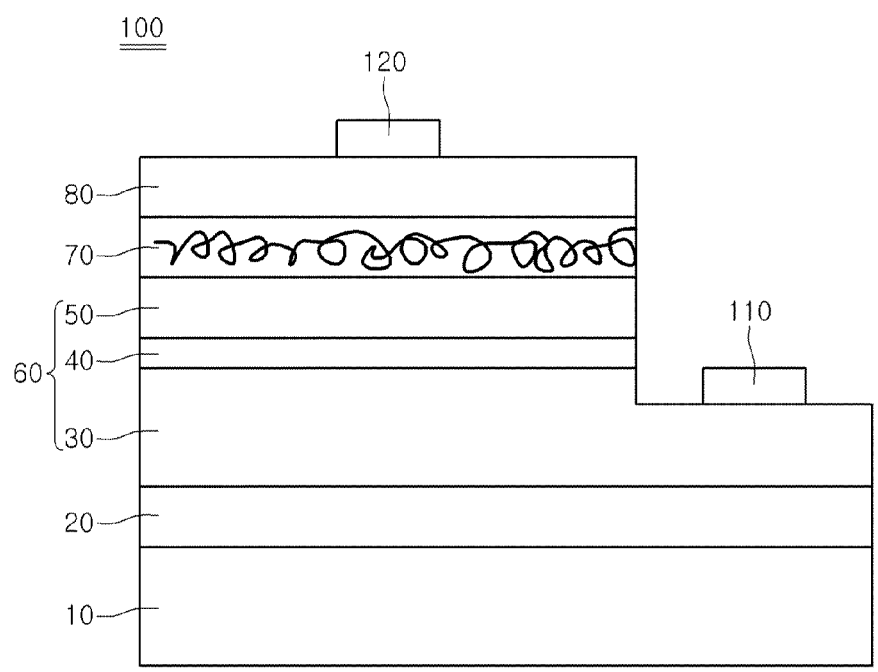
FIG. 1 is a view illustrating a light emitting device and a process of manufacturing the light emitting device according to a first embodiment.

In the descriptions of embodiments, it will be understood that when a layer (or film), a region, a pattern, or a structure is referred to as being 'on' a substrate, a layer (or film), a region, a pad, or patterns, it can be directly on another layer or substrate, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings.

Hereinafter, embodiments will be described with reference to the accompanying drawings. In the drawings, the thickness or size of each layer is exaggerated, omitted, or schematically illustrated for convenience in description and clarity. Also, the size of each element does not entirely reflect an actual size.

FIG. 1 is a view illustrating a light emitting device and a process of manufacturing the light emitting device according to an embodiment. FIG. 1 illustrates a lateral type light emitting device as an example.

Referring to FIG. 1, a growth substrate 10 may be prepared. For example, the growth substrate 10 may be formed of at least one selected from the group consisting of sapphire ($Al_2O_3$) single crystal, SiC, GaAs, GaN, MgO, ZnO, Si, $Ga_2O_3$, GaP, InP, Ge, and glass, but is not limited thereto.

A plurality of patterns may be formed on a top surface of the growth substrate 10 to promote the growth of a light emitting structure 60 that will be formed later and improve light emitting efficiency of the light emitting device, but is not limited thereto.

A buffer layer 20 may be formed on the growth substrate 10. The buffer layer 20 may be formed of undoped nitride. For example, the buffer layer 20 may be formed of an undoped GaN-based semiconductor material.

The buffer layer 20 may have a significantly low conductivity when compared to that of a first conductive type semiconductor layer 30 of the light emitting structure 60 because a dopant is not doped into the buffer layer 20.

The buffer layer 20 may be grown to improve a crystalline of the first conductive type semiconductor layer 30. That is to say, the buffer layer 20 may reduce a lattice constant different between the first conductive type semiconductor layer 30 and the growth substrate 10.

When the growth substrate 10 having a less lattice constant difference with the light emitting structure 60 is used, the buffer layer 20 may be omitted.

The light emitting structure 60 may be formed on the buffer layer 20.

The light emitting structure 60 may include a first conductive type semiconductor layer 30, an active layer 40, and a second conductive type semiconductor layer 50. The light emitting structure 60, i.e., the first conductive type semiconductor layer 30, the active layer 40, and the second conductive type semiconductor layer 50 may be formed of at least one of group III-V compound semiconductor materials.

The first conductive type semiconductor layer 30 may be formed on the buffer layer 20. When the buffer layer 20 is not formed, the first conductive type semiconductor layer 30 may be directly formed on the growth substrate 10.

For example, the first conductive type semiconductor layer 30 may be an N-type semiconductor layer containing an N-type dopant. The first conductive type semiconductor layer 30 may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., at least one selected from the group consisting of InAlGaN, GaN, AlGaN, InGaN, AlN, InN, and AlInN. Here, the first conductive type semiconductor layer 30 may be doped with an N-type dopant such as Si, Ge, or Sn.

The active layer 40 may be disposed on the first conductive type semiconductor layer 30.

The active layer 40 is a layer in which electrons (or holes) injected through the first conductive type semiconductor layer 30 and holes (or electrons) injected through the second conductive type semiconductor layer 50 may be recombined with each other to emit light having a wavelength corresponding to a band gap difference of an energy band depending on a formation material of the active layer 40.

The active layer 40 may have one of a single quantum well structure, a multi quantum well (MQW) structure, a quantum dot structure, and a quantum wire structure. The active layer 40 may have a repeated cycle of a well layer and a barrier layer, which are formed of a group III-V compound semiconductor material.

For example, the active layer 40 may have a cycle of an InGaN well layer/GaN barrier layer, a cycle of an InGaN well layer/AlGaN barrier layer, or a cycle of an InGaN well layer/InGaN barrier layer. The barrier layer may have a band gap greater than that of the well layer.

The second conductive type semiconductor layer 50 may be formed on the active layer 40. For example, the second conductive type semiconductor layer 50 may be a P-type semiconductor layer containing a P-type dopant. The second conductive type semiconductor layer 50 may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., at least one selected from the group consisting of InAlGaN, GaN, AlGaN, InGaN, MN, InN, and AlInN. Here, the second conductive type semiconductor layer 50 may be doped with a P-type dopant such as Mg, Zn, Ca, Sr, or Ba.

As described above, the first conductive type semiconductor layer 30 may include the type semiconductor layer, and the second conductive type semiconductor layer 50 may include the N-type semiconductor layer. Also, a third conductive type semiconductor layer (not shown) including the N-type or P-type semiconductor layer may be formed on the second conductive type semiconductor layer 50. Thus, the light emitting device 100 may have at least one of an NP junction structure, a PN junction structure, an NPN junction structure, and a PNP junction structure. Also, impurities may be uniformly or non-uniformly doped into the first and second conductive type semiconductor layers 30 and 50. That is, the light emitting structure 60 layer may have various structures, but is not limited thereto.

An etching process for selectively etching the light emitting structure 60 may be performed to partially expose an upper region of the first conductive type semiconductor layer 30. That is, a mesa etching process may be performed to successively remove a portion of the second conductive type semiconductor layer 50 and a portion of the active layer 40 of the light emitting structure 60, thereby partially exposing an upper region of the first conductive type semiconductor layer 30 which is etched at a predetermined depth from a top surface of the first conductive type semiconductor layer 30.

A current spreading layer 70 may be formed on the light emitting structure 60. That is to say, the current spreading layer 70 may be formed on the second conductive type semiconductor layer 50.

The current spreading layer 70 may have the same area as that of at least the second conductive type semiconductor layer 50. Also, the current spreading layer 70 may contact the entire region of the second conductive type semiconductor layer 50.

The current spreading layer 70 may quickly spread a current in a side direction parallel to that of a surface of the second conductive type semiconductor layer 50. As described above, since the current is quickly spread into the entire region of the current spreading layer 70 and also uniformly supplied into the entire region of the second conductive type semiconductor layer 50 contacting the current spreading layer 70, light may uniformly be emitted from the entire region of the active layer 40 to maximize light extraction efficiency.

The current spreading layer 70 may include a plurality of carbon nanotube bundles. The carbon nanotube bundle may represent a bundle in which a plurality of single-walled carbon nanotubes (SWCNTs) are tied up.

Generally, the SWCNT may have a cylindrical structure having a diameter of about 1 nm. The SWCNT may have a superior optical transmittance and semiconductor characteristics.

On the other hand, a multi-walled carbon nanotube (hereinafter, referred to as an "MTCNT") may include multi rolled layers.

Although the MWCNT has only very superior metallic characteristics, an optical transmittance thereof is significantly low when compared to that of the SWCNT.

The embodiment may provide a network structure in which the plurality of nanotube bundles in which the plurality of SWCNTs are tied up together with each other are physically connected to each other. That is, the embodiment may have a network structure in which the plurality of carbon nanotube bundles are connected to each other, and each of the carbon nanotube bundles may include the plurality of SWCNTs.

Figure 2:
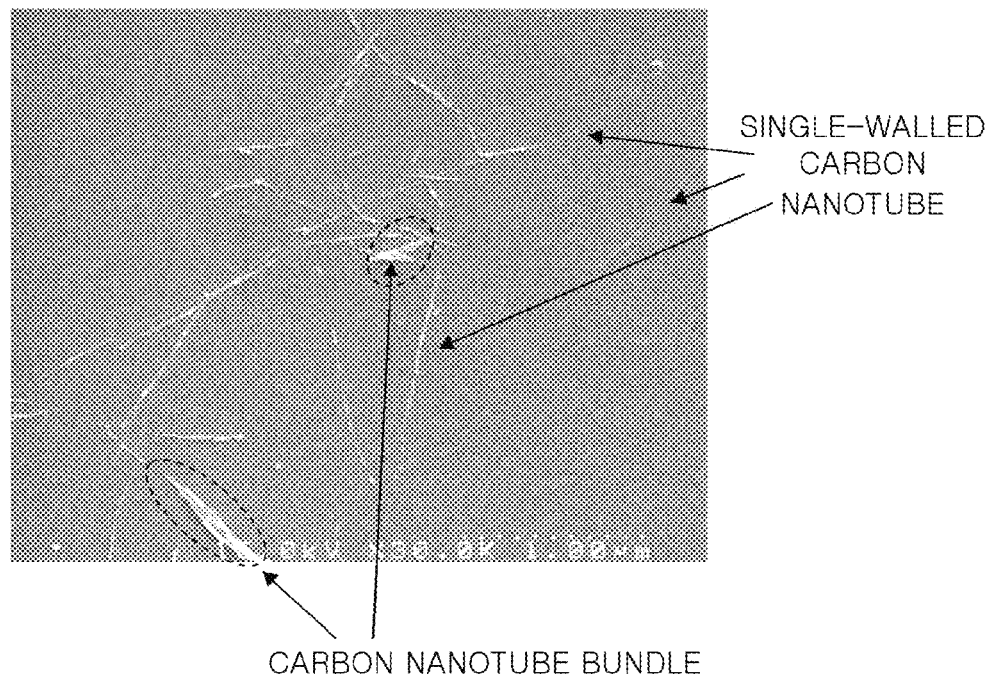
FIG. 2 is a view of a single carbon nanotube and a carbon nanotube bundle.

As shown in FIG. 2, each of the SWCNTs has a very small diameter and semiconductor characteristics. However, the carbon nanotube bundle has the structure in which the plurality of SWCNTs are bundled together with each other, the carbon nanotube bundle may have very superior metallic characteristics.

Thus, like the embodiment, it is seen that the semiconductor characteristics are changed into the metallic characteristics as the SWCNTs are tied up together with each other to form the carbon nanotube bundle.

Furthermore, since the plurality of carbon nanotube bundles are physically connected to each other to form a network structure, the carbon nanotube bundle may have an optical transmittance similar to that of the SWCNT and more superior conductivity than that of SWCNT. Thus, the current may be quickly spread.

A density of the plurality of carbon nanotube bundles may be adjusted by the number of dip coating. That is to say, a density of the plurality of carbon nanotube bundles may be increased as the number of dip coating is increased.

The carbon nanotube bundle may be manufactured by the dip coating.

The growth substrate 10 is immersed into a container (not shown) containing a carbon nanotube solution to coat the carbon nanotube solution on the light emitting structure 60 of the growth substrate 10.

In detail, a surface of an upper portion of the second conductive type semiconductor layer 50 of the growth substrate 10 contacts the carbon nanotube solution for a predetermined time, and then, the growth substrate 10 is spaced from the carbon nanotube solution.

As this dip coating process is repeatedly performed, the current spreading layer 70 including the plurality of carbon nanotube bundles physically connected to each other and having the network structure may be disposed on the second conductive type semiconductor layer 50 of the growth substrate 10.

Figure 3A:
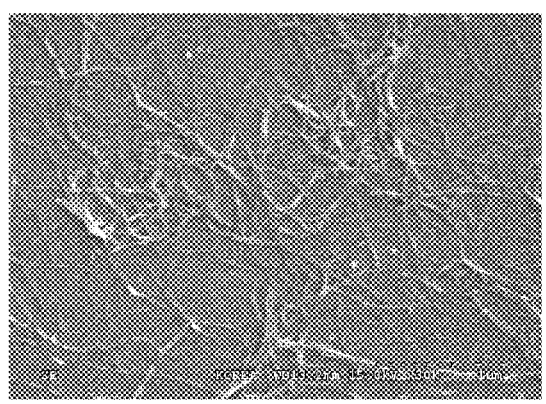
FIGS. 3A to 3C are views illustrating densities of the carbon nanotube bundle.

As shown in FIG. 3A, when the number of dip coating is relatively less, a small number of carbon nanotube bundles may be formed and the plurality of SWCNTs may exist. Thus, the conductivity may be low as a whole.

Figure 3B:
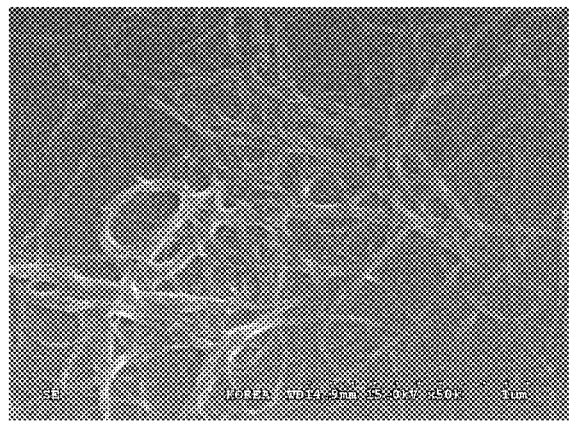

As shown in FIG. 3B, when the number of dip coating is increased more than that of FIG. 3A, the number of the carbon nanotube bundles may be increased to increase the conductivity as a whole.

Figure 3C:
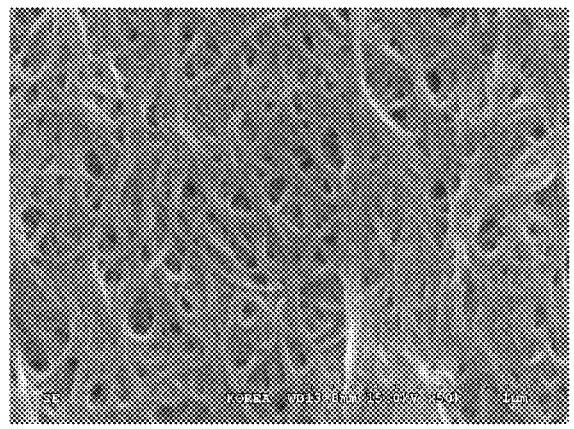

As shown in FIG. 3C, when the number of dip coating is increased more than that of FIG. 3B, the number of carbon nanotube bundles may be further increased as well as the carbon nanotube bundles may be physically connected to each other and have the network structure. Thus, the current may be quickly spread and the conductivity may be very improved.

The current spreading layer 70 including the plurality of carbon nanotube bundles having the network structure may have a thickness of about 10 nm to about 70 nm.

When the current spreading layer 70 has a thickness of about 10 nm or less, the plurality of carbon nanotube bundles may not form the network structure. Thus, the conductivity may be lowered.

In addition, when the current spreading layer 70 has a thickness of about 70 nm or more, a void between the carbon nanotube bundles may be expanded in volume due to heat when the carbon nanotube bundles are thermally treated by the transparent conductive layer in a successive process such that the transparent conductive layer may peel off.

In the embodiment, a density (or distribution) of the carbon nanotube bundle may range from about 30% to about 90% of the entire area of the second conductive type semiconductor layer 50.

When the density of the carbon nanotube bundle is equal to or less than about 30% of the entire area of the second conductive type semiconductor layer 50, the conductivity may be lowered. When the density of the carbon nanotube bundle is equal to or greater than about 90% of the entire area of the second conductive type semiconductor layer 50, the transparent conductive layer may peel off due to the volume expansion of the void between the carbon nanotube bundles.

In the embodiment, the current spreading layer 70 has very superior current spreading characteristics and an optical transmittance of about 90% or more. Specifically, when the current spreading layer 70 according to the embodiment is provided, the optical power may be increased by about 60% or more when compared that the current spreading layer 70 is not provided.

Since the etching process for exposing the first conductive type semiconductor layer 30 is performed before the current spreading layer 70 is formed, it is unnecessary to etch the current spreading layer 70 to expose the first conductive type semiconductor layer 30.

If the current spreading layer 70 is etched to expose first conductive type semiconductor layer 30 after the current spreading layer 70 is formed, equipment contamination due to the carbon nanotube material may occur.

A transparent conductive layer 80 may be disposed on the current spreading layer 70. For example, the transparent conductive layer 80 may be formed of one selected from the group consisting of transparent conductive oxide materials such as Indium tin oxide (ITO), ZnO, aluminum doped zinc oxide (AZO) indium zinc oxide (IZO), antimony tin oxide (ATO), and zinc indium-tin oxide (ZITO).

A first electrode 110 may be disposed on the first conductive type semiconductor layer 30, and a second electrode 120 may be disposed on the transparent conductive layer 80 to manufacture the light emitting device 100 according to the embodiment.

Since the transparent conductive layer 80 is formed of oxide-based material to have a relatively high resistance than a metal material, the current spreading may be reduced.

Thus, the transparent conductive layer 80 may not be provided. In this case, the second electrode 120 may be directly disposed on the current spreading layer 70.

When a power is supplied into the first and second electrodes 110 and 120, a current may flow from the second electrode 120 to the first electrode through the light emitting structure.

The current of the second electrode 120 may be quickly spread into the entire region of the current spreading layer 70 by the current spreading layer 70. In addition, the current may be uniformly supplied into the entire region of the second conductive type semiconductor layer 50 surface-contacting the current spreading layer 70 to emit light from the entire region of the active layer 40. Therefore, light extraction efficiency may be maximized.

Figure 4:
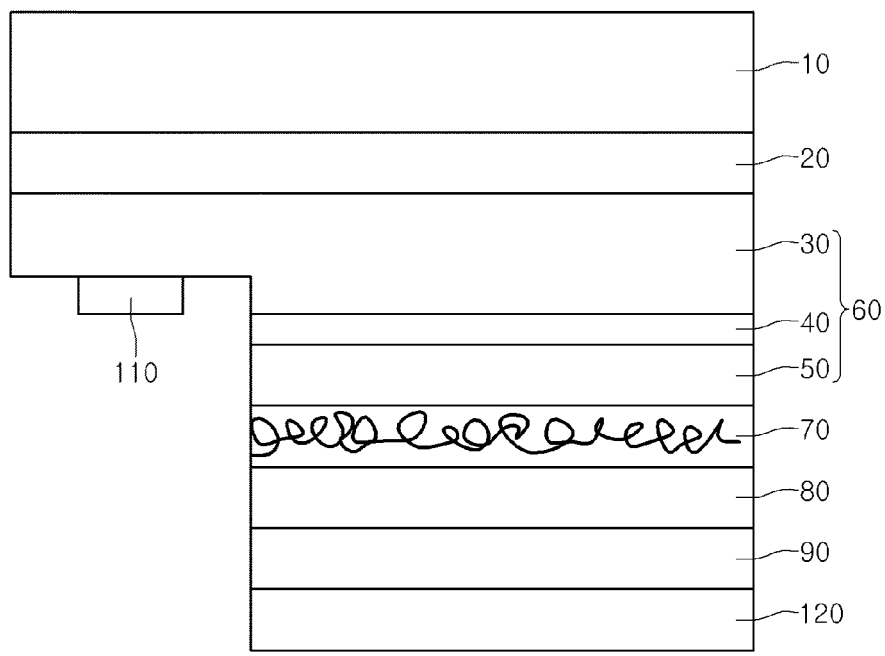
FIG. 4 is a view illustrating a light emitting device and a process of manufacturing the light emitting device according to a second embodiment.

FIG. 4 is a view illustrating a light emitting device and a process of manufacturing the light emitting device according to a second embodiment.

In the description of the light emitting device according to the second embodiment, the descriptions duplicated with those of FIG. 1 will be omitted. FIG. 4 illustrates a flip-chip type light emitting device as an example.

That is, a light emitting device 100A according to the second embodiment may have a shape turning the light emitting device according to the first embodiment inside out.

The second embodiment is similar to the first embodiment except that a reflective layer 90 is formed on a transparent conductive layer 80 and a second electrode 120 is formed on the reflective layer 90.

Referring to FIG. 4, the light emitting device 100A according to the second embodiment has the same operation characteristic as that of the light emitting device 100 according to the first embodiment. However, they have structural difference depending on an installation type of the light emitting device.

That is, the reflective layer 90 may be formed on the transparent conductive layer 80. When the transparent conductive layer is not provided in the light emitting device 100 according to the first embodiment, the reflective layer 90 may be directly formed on a current spreading layer 70. That is, the reflective layer 90 may surface-contact the current spreading layer 70.

The reflective layer 90 may reflect light emitted from an active layer 40.

The reflective layer 90 may be formed of at least one selected from the group consisting of silver (Ag), aluminum (Al), platinum (Pt), and palladium (Pd), which have high reflection efficiency.

The second electrode 120 may be formed on the reflective layer 90.

The first electrode 120, the reflective layer 90, the current spreading layer 70, and a second conductive type semiconductor layer may have the same area as each other. The second electrode 120, the reflective layer 90, and the current spreading layer 70, and the second conductive type semiconductor layer 50 may be successively etched to expose the first conductive type semiconductor layer 30, thereby easily realizing the same area.

In the flip-chip type light emitting device, light emitted from the active layer may be reflected by the reflection layer 90. Thus, the flip-chip type may be a top emission type in which the most of light is emitted.

Figure 5:
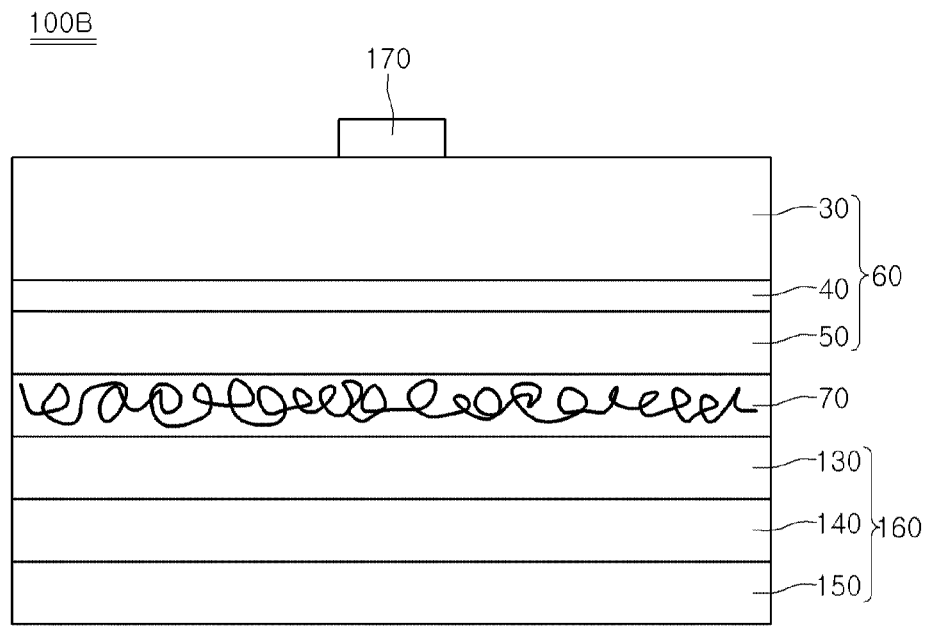
FIG. 5 is a view illustrating a light emitting device and a process of manufacturing the light emitting device according to a third embodiment.

FIG. 5 is a view illustrating a light emitting device and a process of manufacturing the light emitting device according to a third embodiment.

In the description of the light emitting device 100B according to the third embodiment, the descriptions duplicated with those of FIGS. 1 and 4 will be omitted. FIG. 5 illustrates a vertical type light emitting device as an example.

Referring to FIG. 5, as shown in FIG. 1, a buffer layer 20, a light emitting structure 60, and a current spreading layer 70 may be successively formed on a growth substrate 10. A first conductive type semiconductor layer 30, an active layer 40, and a second conductive type semiconductor layer 50 may be successively formed on the growth substrate 10 to form the light emitting structure 60.

Then, a support member 160 may be formed on the current spreading layer 70. An ohmic contact layer 130, a reflection member 140, and a conductive support member 150 may be successively formed on the current spreading layer 170 to form the support member 160.

The ohmic contact layer 130 may be formed of the same material as that the transparent conductive layer 80 of FIGS. 2 and 3. For example, a transparent conductive material and a metal may be selectively used as the ohmic contact layer 150. That is, the ohmic contact layer 150 may be realized as a single or multi layer by using at least one selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni, Ag, Pt, Ni/IrOx/Au, and Ni/IrOx/Au/ITO.

For example, the reflection member 140 may be formed of a metal or alloy containing at least one selected from the group consisting of Ag, Ni, Al, Rh, Pd, Ir, Ru, Mg, Zn, Pt, Au, and Hf, but is not limited thereto. Also, the reflection member 140 may have a multi-layered structure using at least one transparent conductive material of IZO(In—ZnO), GZO (Ga—ZnO), AZO(Al—ZnO), AGZO(Al—Ga—ZnO), IGZO(In—Ga—ZnO), IZTO(indium zinc tin oxide), IAZO (indium aluminum zinc oxide), IGTO(indium gallium tin oxide), and ATO(aluminum tin oxide).

The conductive support member 150 may include a support member having conductivity.

For example, the conductive support member 150 may be formed of at least one selected from the group consisting of titanium (Ti), chrome (Cr), nickel (Ni), aluminum (Al), platinum (Pt), gold (Au), tungsten (W), copper (Cu), molybdenum (Mo), copper-tungsten (Cu—W), and carrier wafers such as Si, Ge, GaAs, ZnO, SiC, SiGe, and GaN.

Then, the growth substrate 10 may be tuned upside down, and the growth substrate 10 and the buffer layer 20 may be removed. Then, an electrode 170 may be formed on the first conductive type semiconductor layer 30 to manufacture the light emitting device 100B according to the third embodiment.

As described above, the current spreading layer 70 may be applied to the lateral type light emitting device (reference numeral 100 of FIG. 1) according to the first embodiment, the flip-chip type light emitting device (reference numeral 100A of FIG. 4) according to the second embodiment, and the vertical type light emitting device 100B according to the third embodiment.

Figure 6:
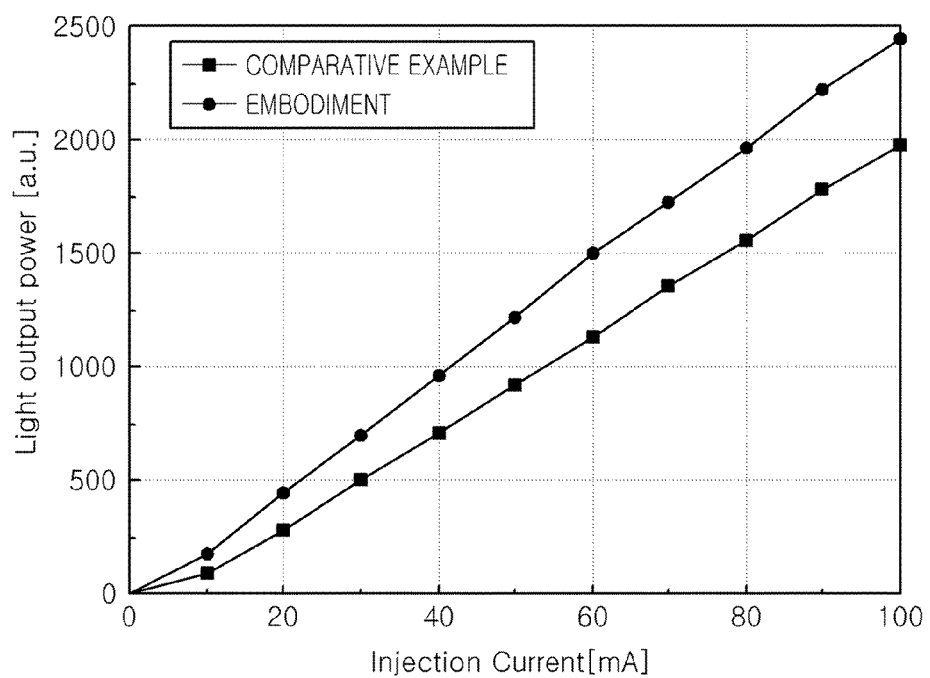
FIG. 6 is a view illustrating an optical power of a light emitting device according to an embodiment.

FIG. 6 is a view illustrating an optical power of a light emitting device according to an embodiment.

In a comparative example, an optical power is illustrated as an example when GaN is used for the second conductive type semiconductor layer 50 and ITO is used for the transparent conductive layer 80 on the second conductive type semiconductor layer 50. In the embodiment, an optical power is illustrated as an example when GaN is used for the second conductive type semiconductor layer 50, ITO is used for the transparent conductive layer 80, and the current spreading layer 70 is disposed between the second conductive type semiconductor layer 50 and the transparent conductive layer 80.

As shown in FIG. 6, since the current spreading layer 70 is provided in the light emitting devices 100, 100a, and 100b according to the first to third embodiments, the optical power may be improved when compared to that of the comparative example in case where the same current is applied. Furthermore, it is seen that the more the current is increased, the more the optical power according to the embodiment is increased when compared to that of the comparative example.

Figure 7:
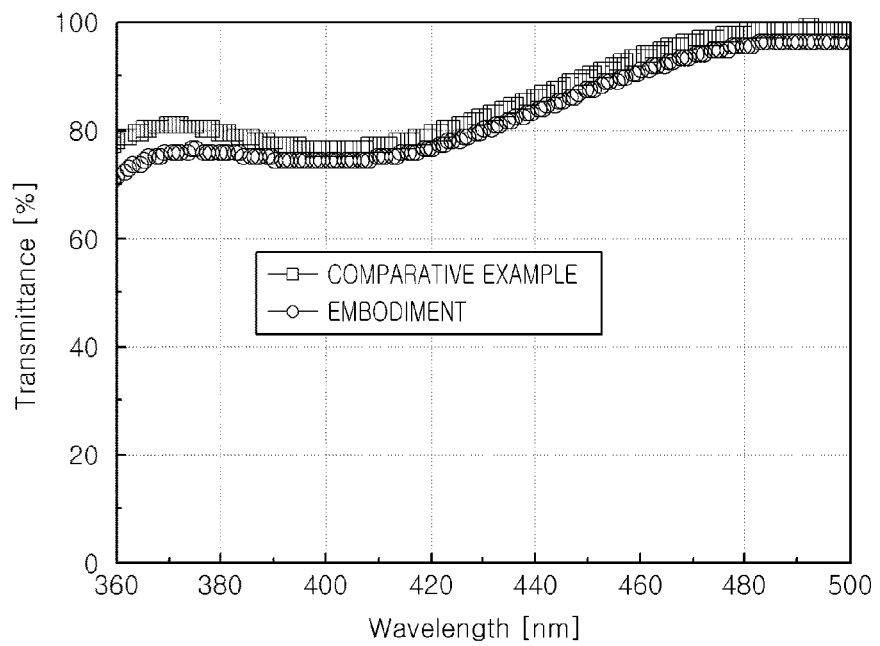
FIG. 7 is a view illustrating an optical transmittance of a light emitting device according to an embodiment.

FIG. 7 is a view illustrating an optical transmittance of a light emitting device according to an embodiment.

A comparative example may use the same material as that of comparative example of FIG. 6.

Figure 8:
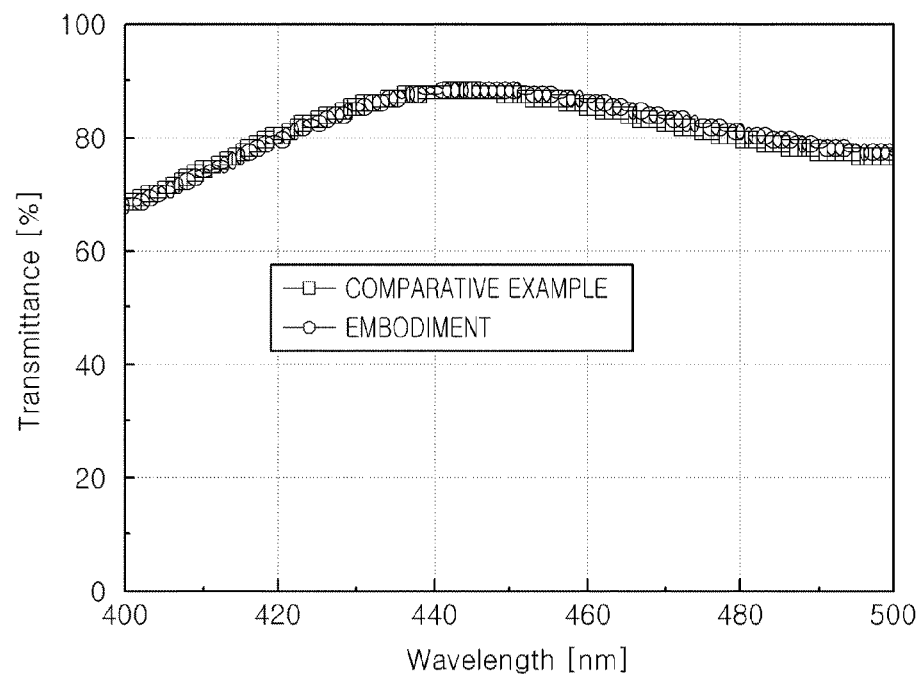
FIG. 8 is a view illustrating an optical transmittance in a case where a low-density current spreading layer is used.

FIG. 7 illustrates an optical transmittance in case where a high-density current spreading layer 70 is used. FIG. 8 illustrates an optical transmittance in case where a low-density current spreading layer 70 is used.

As shown in FIG. 7, even though the high-density current spreading layer 70 is used in the embodiment, an optical transmittance of the embodiment is slightly different from that of the comparative example only in light having a wavelength of about 400 nm or less. However, in light having a wavelength of about 400 nm or more, the embodiment and the comparative example have the substantially same optical transmittance as each other.

As shown in FIG. 8, when the low-density current spreading layer 70 is used, the embodiment and the comparative example have the substantially same optical transmittance as each other in light having the entire wavelength.

Furthermore, even though the high-density or low-density current spreading layer 70 is used, the optical transmittances according to the embodiment and the comparative example may be equal to each other.

Referring to FIGS. 6 to 8, it is seen that the optical power may be significantly improved while the optical transmittance is maintained substantially equal to that of the existing light emitting device.

Figure 9:
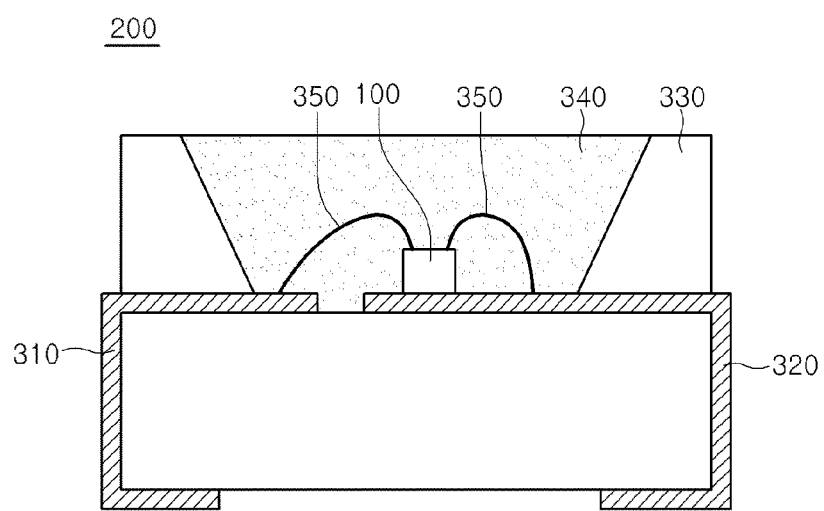
FIG. 9 is a sectional view of a light emitting device package including the light emitting device according to the embodiments.

FIG. 9 is a sectional view of a light emitting device package including the light emitting device according to the embodiments.

Referring to FIG. 9, a light emitting device package 200 according to an embodiment includes a body 330, first and second conductive layers 310 and 320 disposed on the body 330, a light emitting device 100 disposed on the body 330 to receive a power from the first and second conductive layers 310 and 320, and a molding member 340 surrounding the light emitting device 100.

The body 330 may be formed of a silicon material, a synthetic resin material, or a metal material. An inclined surface may be disposed around the light emitting device 100.

The first conductive layer 310 and the second conductive layer 320 are electrically separated from each other and supply a power to the light emitting device 100.

Also, the first and second conductive layers 310 and 320 may reflect light generated in the light emitting device 100 to improve light efficiency and may release heat generated in the light emitting device 100 to the outside.

The light emitting device 100 may be disposed on one of the first conductive layer 310, the second conductive layer 320, and the body 330. Also, the light emitting device 100 may be electrically connected to the first and second conductive layers 310 and 320 through a wiring process or a die bonding process.

Although the light emitting device 100 according to the first embodiment is illustrated as an example, the first and second conductive layers 310 and 320 may be electrically connected to each other through two wires 350. Alternatively, in case of the light emitting device 100 according to the second embodiment, the first and second conductive layers 310 and 320 may be electrically connected to each other without using the wire 350. Also, in case of the light emitting device 100 according to the third embodiment, the first and second conductive layers 310 and 320 may be electrically connected to each other using one wire 350.

The molding member 340 may surround the light emitting device 100 to protect the light emitting device 100. The molding member 340 may include a phosphor to vary a wavelength of light emitted form the light emitting device 100.

Also, the light emitting device package 200 may include a chip on board (COB) type light emitting device package. The body 330 may have a flat top surface and a plurality of light emitting devices 100 may be disposed on the body 330.

The plurality of light emitting device packages 200 according to an embodiment may be arrayed on a board. Optical members such as a light guide plate, a prism sheet, a diffusion sheet, and a fluorescence sheet may be disposed on a path of the light emitted from the light emitting device packages 200.

The light emitting device packages 200, the board, the optical members may serve as a backlight unit. In another embodiment, the light emitting device packages 200, the board, the optical members may serve as a light unit including the light emitting device 100 or the light emitting device package 200 according to the foregoing embodiments. For example, the lighting unit may include display devices, indicating devices, lamps, and streetlamps.

Figure 10:
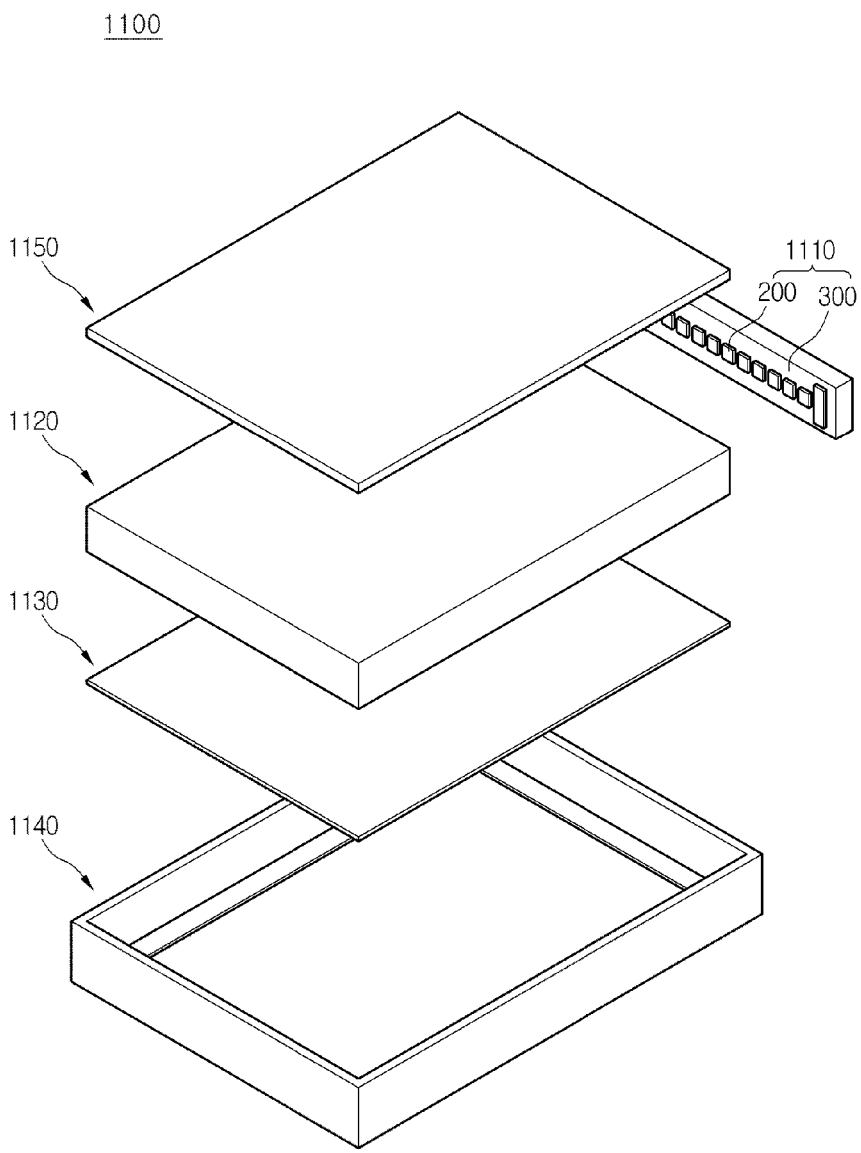
FIG. 10 is a view of a backlight unit including the light emitting device or the light emitting device package according to the embodiment.

FIG. 10 is a view of a backlight unit including the light emitting device or the light emitting device package according to the embodiment. However, a backlight unit 1100 of FIG. 10 is described as an example of the lighting system. Thus, the present disclosure is not limited thereto.

Referring to FIG. 10, the backlight unit 1100 may include a bottom cover 1140, a light guide member 1120 disposed within the bottom cover 1140, and a light emitting module 1110 disposed on at least one side or a bottom surface of the light guide member 1120. Also, a reflective sheet 1130 may be disposed under the light guide member 1120.

The bottom cover 1140 may have a box shape with an opened upper side to receive the light guide member 1120, the light emitting module 1110, and the reflective sheet 1130. The bottom cover 1140 may be formed of a metal material or a resin material, but is not limited thereto.

The light emitting module 1110 may include a board 300 and a plurality of light emitting devices 100 or light emitting device packages 200 mounted on the board 300. The plurality of light emitting devices 100 or the light emitting device packages 200 may provide light to the light guide member 1120. Here, the light emitting device package 200 disposed on the board 300 will be described as an example.

As shown in FIG. 10, the light emitting module 1110 may be disposed on at least one of inner surfaces of the bottom cover 1140. Thus, the light emitting module 1110 may provide light toward at least one side surface of the light guide member 1120.

However, the light emitting module 1110 may be disposed under the bottom cover 1140 to provide light toward an under surface of the light guide member 1120. Since this structure is variously varied according to a design of the backlight unit 1100, the present disclosure is not limited thereto.

The light guide member 1120 may be disposed within the bottom cover 1140. The light guide member 1120 may receive the light provided from the light emitting module 1110 to produce planar light, thereby guiding the planar light to a display panel (not shown).

For example, the light guide member 1120 may be a light guide panel (LGP). The LGP may be formed of one selected from the group consisting of resin-based materials such as polymethyl methacrylate (PMMA), a polyethylene terephthalate (PET) resin, a poly carbonate (PC) resin, a cyclic olefin copolymer (COC) resin, and a polyethylene naphthalate (PEN) resin.

An optical sheet 1150 may be disposed above the light guide member 1120.

For example, the optical sheet 1150 may include at least one of a diffusion sheet, a light collection sheet, a brightness enhancement sheet, and a fluorescence sheet. For example, the diffusion sheet, the light collection sheet, the brightness enhancement sheet, and the fluorescence sheet may be stacked to form the optical sheet 1150. In this case, the diffusion sheet 1150 may uniformly diffuse light emitted from the light emitting module 1110, and the diffused light may be collected into the display panel (not shown) by the light collection sheet. Here, the light emitted from the light collection sheet is randomly polarized light. The bright enhancement sheet may enhance a degree of polarization of the light emitted from the light collection sheet. For example, the light collection sheet may be a horizontal and/or vertical prism sheet. Also, the bright enhancement sheet may be a dual brightness enhancement film. Also, the fluorescence sheet may be a light transmitting plate or film including a phosphor.

The reflective sheet 1130 may be disposed under the light guide member 1120. The reflective sheet 1130 reflects the light emitted through the bottom surface of the light guide member 1120 toward a light emission surface of the light guide member 1120.

The reflective sheet 1130 may be formed of a material having superior reflectance, e.g., a PET resin, a PC resin, or a PVC resin, but is not limited thereto.

Figure 11:
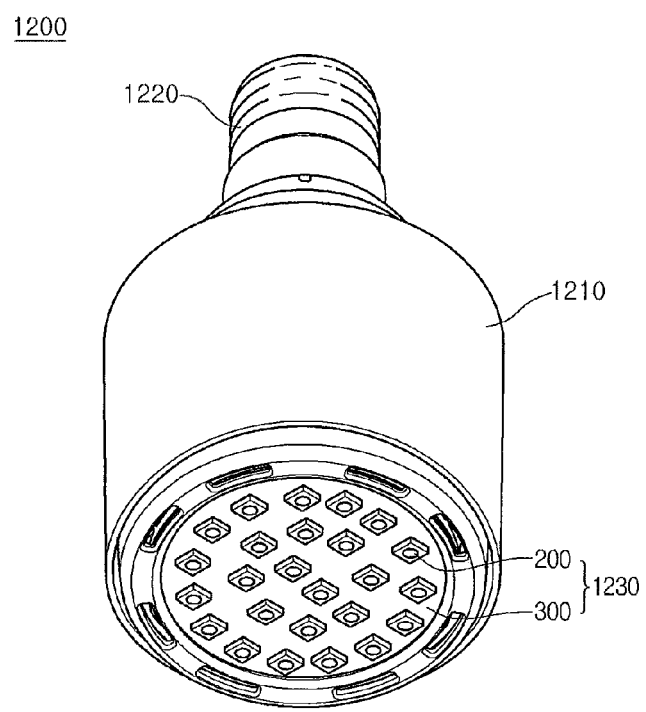
FIG. 11 is a perspective view of a lighting unit including the light emitting device or the light emitting device package according to the embodiment.

FIG. 11 is a perspective view of a lighting unit using a light emitting device 100 or light emitting device package 200 according to an embodiment. However, a lighting unit 1200 of FIG. 11 is described as an example of the lighting system. Thus, the present disclosure is not limited thereto.

Referring to FIG. 11, the lighting unit 1200 may include a case body 1210, a light emitting module 1230 disposed on the case body 1210, a connection terminal 1220 disposed on the case body 1210 to receive a power from an external power source.

The case body 1210 may be formed of a material having good thermal dissipation properties, e.g., a metal material or a resin material.

The light emitting module 1230 may include a board 300 and a plurality of light emitting devices 100 or light emitting device packages 200 mounted on the board 300. Here, the light emitting device package 200 disposed on the board 300 will be described as an example.

A circuit pattern may be printed on a dielectric to manufacture the board 300. For example, the board 300 may include a printed circuit board (PCB), a metal core PCB, a flexible PCB, and a ceramic PCB.

Also, the board 300 may be formed of a material which may effectively reflect light or have a color by which light is effectively reflected, e.g., a white color or a silver color.

The at least one light emitting device package 200 may be mounted on the board 300. The light emitting device package 200 may include at least one light emitting diode (LED). The LED may include colored LEDs, which respectively emit light having a red color, a green color, a blue color, and a white color and an ultraviolet (UV) LED emitting UV rays.

The light emitting module 1230 may have various combinations of light emitting devices to obtain intended color tone and brightness. For example, the white LED, the red LED, and the green LED may be combined with each other to secure a high color rendering index. Also, a fluorescence sheet may be further disposed on a path of light emitted from the light emitting module 1230. The fluorescence sheet may change a wavelength of light emitted from the light emitting module 1230. For example, when the light emitted from the light emitting module 1230 has a blue wavelength band, the fluorescence sheet may include a yellow phosphor. Thus, the light emitted from the light emitting module 1230 passes through the fluorescence sheet to finally emit white light.

The connection terminal 1220 may be electrically connected to the light emitting module 1230 to supply a power. Referring to FIG. 10, the connected terminal 1220 is screw-coupled to an external power source in a socket manner, but is not limited thereto. For example, the connection terminal 1220 may have a pin shape, and thus, be inserted into the external power source. Alternatively, the connection terminal 1220 may be connected to the external power source by a wire.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a first conductive type semiconductor layer;
a second conductive type semiconductor layer;
an active layer between the first conductive type semiconductor layer and the second conductive type semiconductor layer, the active layer being formed of a semiconductor material;
a current spreading layer on one of the first and second conductive type semiconductor layers, the current spreading layer comprising a plurality of sets of carbon nanotube bundles physically connected to each other;
a first electrode layer disposed on an other one of the first and second conductive type semiconductor layers;
a second electrode layer disposed on a top surface of the current spreading layer;
a transparent conductive layer disposed between the top surface of the current spreading layer and a bottom surface of the second electrode layer; and
a reflection member contacted between the transparent conductive layer and the second electrode layer,
wherein the transparent conductive layer has a material different from the current spreading layer and includes a non-metallic material.

2. The light emitting device according to claim 1, wherein the current spreading layer has a network structure in which the plurality of sets of carbon nanotube bundles are connected to each other.

3. The light emitting device according to claim 2, wherein the current spreading layer physically contacts a top surface of the second conductive type semiconductor layer and a bottom surface of the transparent conductive layer, and
wherein the second conductive type semiconductor layer includes a p-type dopant.

4. The light emitting device according to claim 2, wherein the plurality of sets of carbon nanotube bundles each has a structure in which a plurality of single-walled carbon nanotubes are tied up together with each other.

5. The light emitting device according to claim 1, wherein the plurality of sets of carbon nanotube bundles each has a density ranging from about 30% to about 90% of an area of one of the first and second conductive type semiconductor layers.

6. The light emitting device according to claim 1, wherein the current spreading layer has a thickness of about 10 nm to about 70 nm.

7. The light emitting device according to claim 1, wherein the current spreading layer surface-contacts one of the first and second conductive type semiconductor layers.

8. The light emitting device according to claim 1, wherein the current spreading layer has the same area as an area of one of the first and second conductive type semiconductor layers.

9. The light emitting device according to claim 1, further comprising a support member having conductivity on a top surface of the reflection member.

10. The light emitting device according to claim 9, wherein each of the second electrode layer, the reflection member, and the current spreading layer has the same area as an area of one of the first and second conductive type semiconductor layers.

11. The light emitting device according to claim 1, wherein the current spreading layer includes at least one of an optical transmittance layer or a metallic layer, and wherein the transparent conductive layer includes a conductive oxide material.

12. The light emitting device according to claim 1, wherein the current spreading layer has a conductivity greater than a conductivity of one of the first and second conductive type semiconductor layers.

13. The light emitting device according to claim 1, wherein the current spreading layer physically contacts a top surface of one of the first and second conductive type semiconductor layers and the transparent conductive layer.

14. A light emitting device comprising:
a first conductive type semiconductor layer;
a second conductive type semiconductor layer;
an active layer between the first conductive type semiconductor layer and the second conductive type semiconductor layer, the active layer being formed of a semiconductor material;
a current spreading layer contacting a top surface of the second conductive type semiconductor layer and in which a plurality of sets of carbon nanotube bundles are connected to each other through a network, the plurality of sets of carbon nanotube bundles each comprising a plurality of single-walled carbon nanotubes;
an electrode layer disposed on a top surface of the current spreading layer; and
a conductive layer disposed between the top surface of the current spreading layer and a bottom surface of the electrode layer,
wherein the conductive layer has a material different from the current spreading layer and physically contacts the top surface of the current spreading layer,
wherein the conductive layer includes a non-metallic material,
wherein the conductive layer includes a transparent conductive layer, and
wherein the electrode layer includes a reflection layer and a conductive support member on the reflection layer.

15. The light emitting device according to claim 14, wherein the plurality of sets of carbon nanotube bundles each has a density ranging from about 30% to about 90% of an area of the second conductive type semiconductor layer.

16. The light emitting device according to claim 14, wherein the current spreading layer has a thickness of about 10 nm to about 70 nm.

17. The light emitting device according to claim 14, wherein the current spreading layer has the same area as an area of the second conductive type semiconductor layer.

* * * * *